US009353435B2

(12) United States Patent
Dowden et al.

(10) Patent No.: US 9,353,435 B2
(45) Date of Patent: May 31, 2016

(54) STABILIZING LASER ENERGY DENSITY ON A TARGET DURING PULSED LASER DEPOSITION OF THIN FILMS

(71) Applicant: Los Alamos National Security, LLC, Los Alamos, NM (US)

(72) Inventors: Paul C. Dowden, Los Alamos, NM (US); Quanxi Jia, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 42 days.

(21) Appl. No.: 14/042,167

(22) Filed: Sep. 30, 2013

(65) Prior Publication Data

US 2015/0093519 A1    Apr. 2, 2015

(51) Int. Cl.
  *C23C 14/28*  (2006.01)
  *C23C 14/06*  (2006.01)
  *C23C 14/08*  (2006.01)
  *C23C 14/54*  (2006.01)

(52) U.S. Cl.
  CPC ............. *C23C 14/0641* (2013.01); *C23C 14/08* (2013.01); *C23C 14/28* (2013.01); *C23C 14/542* (2013.01)

(58) Field of Classification Search
  CPC .. C23C 14/28; C23C 14/3485; C23C 18/182; C23C 16/483
  USPC .................................................. 427/586, 596
  See application file for complete search history.

(56) References Cited

U.S. PATENT DOCUMENTS

| 6,322,625 | B2 | 11/2001 | Im |
| 6,566,683 | B1 | 5/2003 | Ogawa et al. |
| 6,639,249 | B2 | 10/2003 | Valliath |
| 7,364,952 | B2 | 4/2008 | Im |

OTHER PUBLICATIONS

Jackson et al, Oxide superconductor and magnetic metal thin film deposition by pulsed laser ablation: a review, 1994, Phys. D: Appl. Phys., 27, p. 1581-1594.*
Ashford, et al., "Pulsed laser ablation and deposition of thin films," Chem. Soc. Rev., 33:23-31, (published on web Aug. 2003).
Christen, et al., "Recent advances in pulsed-laser deposition of complex oxides," J. Phys. Condens. Matter 20:264005-264021, (Jun. 2008).
Dijkkamp et al., "Preparation of Y—Ba—Cu oxide superconductor think films using pulsed laser evaporation from high Tc bulk material," Appl. Phys. Lett. 51(8):619-621 (Aug. 24, 1987).
(Continued)

*Primary Examiner* — Dah-Wei D Yuan
*Assistant Examiner* — Nga Leung V Law
(74) *Attorney, Agent, or Firm* — Samuel L. Borkowsky; Bruce H. Cottrell (57) ABSTRACT

A process for stabilizing laser energy density on a target surface during pulsed laser deposition of thin films controls the focused laser spot on the target. The process involves imaging an image-aperture positioned in the beamline. This eliminates changes in the beam dimensions of the laser. A continuously variable attenuator located in between the output of the laser and the imaged image-aperture adjusts the energy to a desired level by running the laser in a "constant voltage" mode. The process provides reproducibility and controllability for deposition of electronic thin films by pulsed laser deposition.

11 Claims, 8 Drawing Sheets

(56) References Cited

OTHER PUBLICATIONS

Greer, et al., "Large-area pulsed deposition: techniques and applications," J. Vac. Sci. Technol. A 13:(3) 1175-1181, May 1995.

Jackson, et al., "Oxide superconductor and magnetic metal thin film deposition by pulsed laser ablation: a review," J. Phys. D. App. Phys 27:1581-1594 (Feb. 11, 1994).

Lowndes, et al., "Synthesis of novel thin-film materials by pulsed laser deposition," Science:273:898-903, Aug. 16, 1996.

Muenchausen, et al. "High rate growth of YBa2Cu3O7-x thin films using pulsed excimer laser deposition," Journals.cambridge.org/OPL, IP address: 192.12.184.7 (Sep. 5, 2012).

Muenchausen, et al. "Effect of beam parameters on excimer laser deposition of YBa2Cu3O7-o", Appl. Phys. Lett. 56:578-580 (1990).

Norton, et al, "Pulsed-laser deposition of electronic oxides: superconductor and semiconductor applications," Proc. SPIE 3933: Conference on Laser Applications in Microelectronic and Optoelectronic Manufacturing V, San Jose, CA (Jan. 24-26, 2000).

"Pulsed laser deposition of thin films," edited by D. B. Chrisey and G.K. Hubler, John Wiley & Sons, New York, (1994) Chapter 2, ("Equipment"), pp. 23-54.

Shirk, et al., "A review of ultrashort pulsed laser ablation of materials," J. Laser Appl. 10:18-28, (Feb. 1998).

* cited by examiner

STABILIZING LASER ENERGY DENSITY ON A TARGET DURING PULSED LASER DEPOSITION OF THIN FILMS

STATEMENT REGARDING FEDERAL RIGHTS

This invention was made with government support under Contract No. DE-AC52-06NA25396 awarded by the U.S. Department of Energy. The government has certain rights in the invention.

FIELD OF THE INVENTION

The present invention relates generally to pulsed laser deposition and more particularly to stabilizing laser energy density (i.e. fluence) on a target during pulsed laser deposition of a thin film.

BACKGROUND OF THE INVENTION

Pulsed laser deposition has been used for depositing thin films of materials. Metal oxide films, for example, have been prepared using pulsed laser deposition [1].

A typical pulsed laser deposition apparatus includes a gas discharge laser, such as an excimer laser, that provides (1) a pulsed ultraviolet laser beam that has enough energy to ablate (i.e. vaporize material from) a target or targets, (2) optical components to focus the pulsed laser beam on the target(s), and (3) a vacuum chamber to house the target(s) and the substrate(s) where the deposition takes place. Highly crystalline films result from extended surface diffusion of adatoms at a given substrate temperature in between the pulses. Pulsed laser deposition can provide a deposited film with the same stoichiometry as that of the target if the laser energy density (i.e. fluence, expressed in $J/cm^2$) is above a certain minimum threshold.

Growing films of complex materials or multiple component compounds by pulsed laser deposition requires the accurate control of chemical composition and layer thickness. Growing superlattices, for example, requires accurate control of the chemical composition and the individual layer thickness. For growing such films by pulsed laser deposition, it is desirable that the laser spot on the target have a uniform energy density distribution, a constant spot size, and a stable intensity because changes in the energy density, spot size, and/or intensity of the laser beam may not allow for control of layer thickness with unit cell accuracy.

There are many reports related to processing-structure-property relationships for different materials deposited by pulsed laser deposition [2-6]. However, detailed reports related to the controllability and reproducibility of the deposition step are scarce [7, 8]. The scarcity of such reports may be due to a false belief that the growth of thin films by pulsed laser deposition is straightforward. In practice, reproducible depositions can be extremely challenging due to a lack of control of the energy density of the laser beam. Gas discharge lasers such as excimer lasers ArF, KrF, and XeCl are commonly used for pulsed laser deposition. Controlling laser energy density of these gas discharge lasers is complicated because these lasers have notoriously poor beam quality. The laser energy density of such lasers varies spatially from the edge to the center of the beam spot. The beam dimensions also change with the discharge voltage applied across the electrodes of the discharge laser.

The gas in an excimer laser is excited by a high voltage discharge that generates photons for the lasing process. The beam size and shape are directly related to the freshness of the gas and to the drive voltage across the electrodes in the laser. It takes less drive voltage to achieve a desired energy for fresh laser gas than for old gas. Old gas must be driven to much higher voltages to achieve a similar energy as for fresh gas. As a consequence, only a small area of the electrodes will produce a discharge at a lower voltage, resulting in smaller beam dimensions. At higher voltage, a larger area of electrodes is involved, leading to an output with larger dimensions. These things should be considered when calibrating the laser energy density because the focused spot size is directly related to the size of the beam incident on the focusing lens. This is particularly tricky for commercially available excimer lasers (e.g. LAMBDA PHYSIK lasers) operating in a "constant energy" mode in which an operator simply enters a desired energy and the software that controls the laser determines the voltage required to achieve the output energy. The software associated with these lasers makes adjustments so that the voltage is driven higher to increase the beam fluence as the gas ages. As a consequence, the laser energy density of the focused spot on a target can fluctuate from time to time.

Stabilizing the energy density of the laser beam during pulsed laser deposition of a thin film is desirable.

SUMMARY OF THE INVENTION

An embodiment includes a process for stabilizing laser energy density during pulsed laser deposition. The process generates laser beam pulses comprising a first pulsed laser beam of ultraviolet light; and thereafter directing the laser beam pulses to an image-aperture that allows passage of a chosen central portion of the laser beam through the image-aperture while preventing passage of an outer portion of the laser beam through the image-aperture; and thereafter directing the laser beam pulses from the image-aperture to a lens having a focal length, the lens producing a de-magnified image of the image-aperture on a target inside a deposition chamber according to an equation $$\frac{1}{f} = \frac{1}{s_i} + \frac{1}{s_o},$$

wherein f is a value for the focal length of lens, wherein $s_i$ is a value for a distance from the lens to the image of the laser beam pulses on the target, and wherein $s_o$ is a value for a distance from the image-aperture to the lens; and thereafter directing the laser beam pulses from the lens to the target in the deposition chamber, thereby controlling the image size on the target, the laser beam pulses ablating material from the target; and thereafter depositing a film onto the substrate from ablated material from the target.

Another embodiment includes a process for producing an oxide film on a substrate using laser pulses having a stabilized energy density. The process generates laser beam pulses comprising a first pulsed laser beam of ultraviolet light from an excimer laser; and thereafter directing the laser beam pulses to an image-aperture that allows passage of a chosen central portion of the laser beam pulses through the image-aperture while preventing passage of an outer portion of the laser beam pulses through the image-aperture; and thereafter directing the laser beam pulses from the image-aperture to a lens having a focal length, the lens producing a de-magnified image of the image-aperture on a target inside a deposition chamber according to an equation $$\frac{1}{f} = \frac{1}{s_i} + \frac{1}{s_o},$$

wherein f is a value for the focal length of lens, wherein $s_i$ is a value for a distance from the lens to the image of the laser beam on the target, and wherein $s_o$ is a value for a distance from the image-aperture to the lens, the target comprising a metal oxide; and thereafter directing the laser beam pulses from the lens to the target in the deposition chamber, thereby stabilizing the laser energy density on the target, the laser beam pulses ablating material from the target; and thereafter depositing an oxide film onto the substrate from ablated material from the target.

Another embodiment includes an apparatus for depositing ablated material from a target to a substrate. The apparatus includes a deposition chamber for housing a target and a substrate; a substrate inside the deposition chamber; a target inside the deposition chamber, the target comprising a material to be deposited on the substrate; a pulsed discharge gas laser for providing a pulses of a laser beam of ultraviolet light in a beamline and having a laser energy density; a variable attenuator for adjusting the laser energy of the laser beam; an image-aperture in the beamline for producing a de-magnified image of a central portion of the laser beam on the target, where the de-magnified image ratio is defined by $$m = -s_i/s_o$$

wherein $s_i$ is the image distance from the lens to the image on the target, and $s_o$ is the object distance from the image-aperture to the lens.

DETAILED DESCRIPTION

An embodiment apparatus and process for pulsed laser deposition are provided that solve problems found in conventional processes and apparatus that relate to non-uniformity in the energy density of the pulsed laser beam on the target. The embodiment apparatus and process provide a pulsed beam with a more uniform energy density on a target used for pulsed laser deposition, particularly when using a gas discharge laser such as an excimer laser. This effectively reduces non-uniformity effects of fluence on the target due to differences as a result of aging gas.

The effective diameter of a focused laser beam can be approximately determined by the equation $$D = \frac{f\lambda}{\varpi}$$

wherein D a value for the effective diameter of the focused beam spot, wherein f is the value for the focal length of the lens, wherein $\lambda$ is the value of the wavelength of the laser, and wherein $\overline{\omega}$ is the value of the incident beam waist. As the incident beam size ($\overline{\omega}$) increases, the effective diameter of the focused beam spot decreases. For a given laser energy, the energy density of the focused spot on a target increases as the gas ages because the focused spot has a smaller effective area (i.e. the size of the focused spot becomes smaller as the gas ages).

Figure 4:
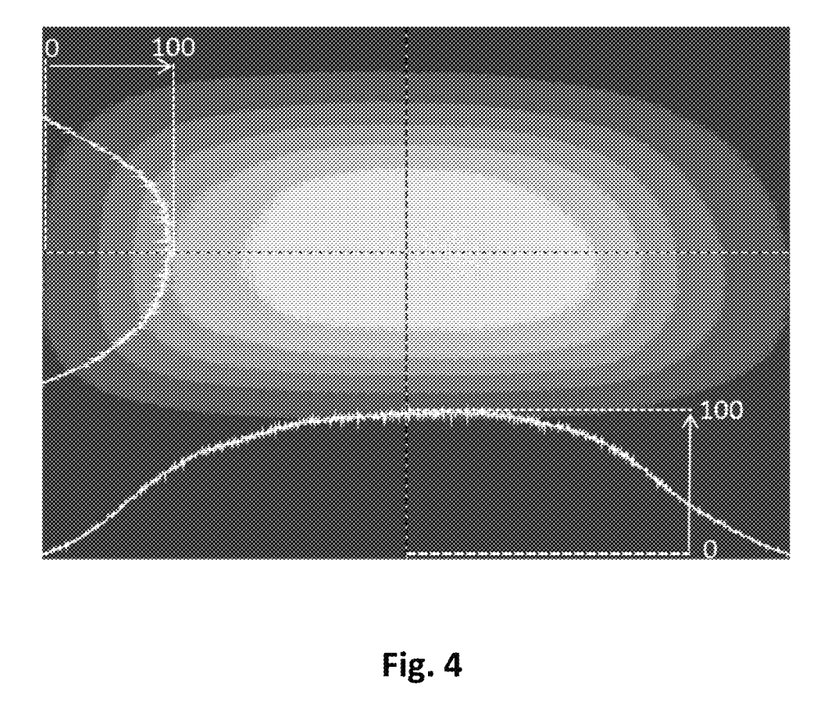
FIG. 4 shows the image of laser beam and laser beam profile right at the out-put (or the laser aperture) of the KrF excimer laser operated at 22 kV. The energy density at the center of the laser aperture is defined as 100.

The shape and density of the plume of material ablated from the target is related to both the laser energy density and the size of the focused spot. Maintaining stable ablation conditions (such as energy density on a target surface) may be challenging if both the spot size and the fluence are changing in an uncontrolled manner. For reproducibly obtaining films having desired properties, the energy density and spot size should be well defined and controlled during deposition of a film. Excimer lasers are routinely used for pulsed laser deposition of films. These lasers have relatively poor beam quality as shown in FIG. 4. In other words, the energy density across a rectangular output beam of an excimer laser is not uniform. The energy is highest within a central region of the beam, and the energy decreases away from the central region. The resulting non-uniformity in energy density has led to problems. For instance, it has been nearly impossible to accurately evaluate the energy density because the area of the focused spot is not well defined. Another problem is that the energy density (i.e. fluence) over the focused spot area is not uniform. This non-uniformity of the fluence causes composition variation of ablated materials due to the spatial distribution of the fluence on the target. The composition variation in the deposited films is exacerbated when a target is composed of two or more cations.

Figure 2A:
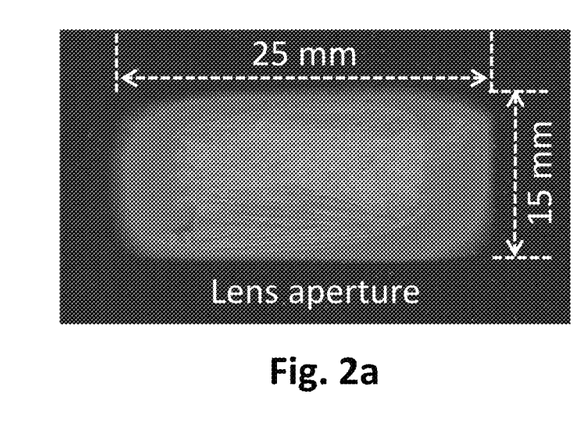
FIG. 2a shows a laser burn spot taken right at the laser aperture from a conventional pulsed laser deposition setup of FIG. 1a and FIG. 2b shows a laser burn spot taken right after the image-aperture from an embodiment apparatus described in FIG. 1b. For both FIGS. 2a and 2b, the output energy from the laser was 770 mJ/pulse. The output energy after the image-aperture is 235 mJ/pulse.
Figure 3A:
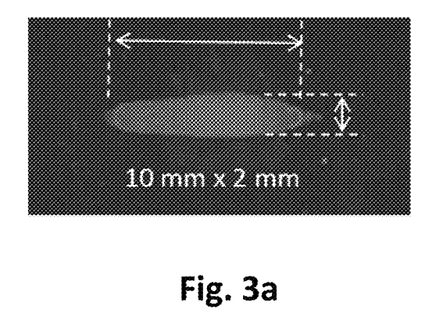
FIG. 3a shows laser burn spot on a target for conventional lens focus of FIG. 1a and FIG. 3b shows laser burn spot on a target for an image focus described in the embodiment of FIG. 1b.

Aspects related to the problems of non-uniformity of laser energy density in a conventional setup are illustrated FIG. 2a and FIG. 3a.

Figure 1A:
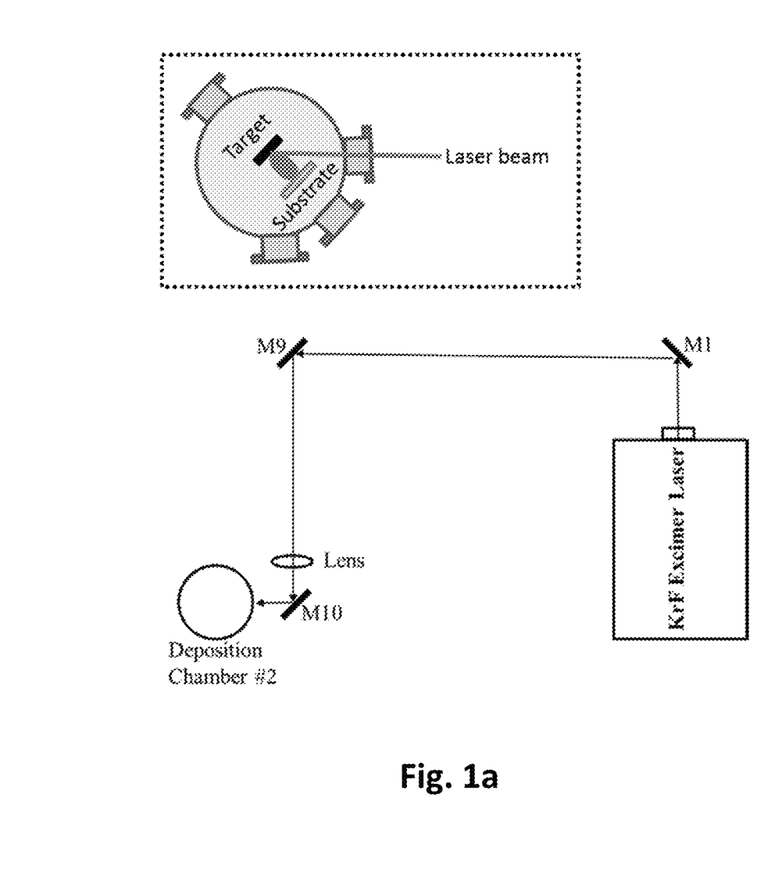
FIG. 1a shows a schematic drawing of an apparatus for conventional pulsed laser deposition.

FIG. 1a provides a schematic diagram for a apparatus used in conventional pulsed laser deposition. The apparatus provides a laser beam initiated from a KrF excimer laser. Mirrors M1 and M9 reflect the beam to a lens. The beam passes through the lens and is then deflected by mirror M10 into a deposition chamber #2 where it impinges on a target and causes ablation. Ablated material from the target is deposited on a substrate that is also inside the deposition chamber.

FIG. 2a shows a photograph of a burn pattern of the beam right after the laser output or laser aperture from this conventional apparatus, and FIG. 3a shows an image of the beam spot that impinges on the target. The burn pattern shown in FIG. 2a shows a more intensely burned central region and a less intensely burned outer region. This indicates a non-uniform energy density distribution across the beam spot.

The outline of the beam spot shown in FIG. 2a is clearly not well defined. The non-uniformity of the beam spot results from a non-uniformity in the energy distribution in the excimer laser output beam shown in FIG. 4. This non-uniformity of the laser beam has led to a non-uniformity in the burn pattern on the target shown in FIG. 3a. This non-uniformity in energy density on the target leads to non-uniform ablation of the target material, which produces problems related to controllability and reproducibility during pulsed laser deposition of a film from a target to the substrate.

These problems are solved by the present embodiments, which are described in more detail below.

Figure 1B:
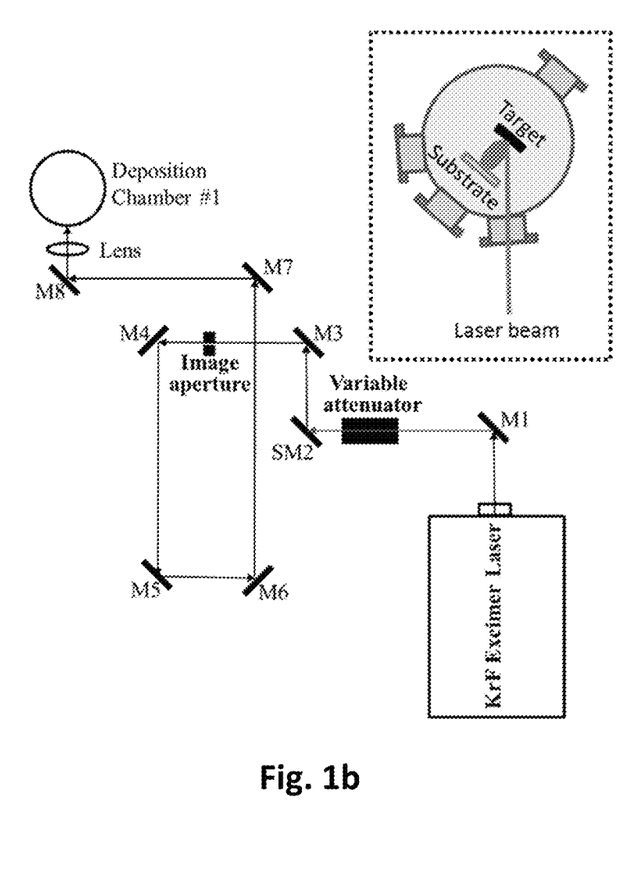
FIG. 1b shows a schematic drawing for an embodiment apparatus for pulsed laser deposition.

FIG. 1b provides a schematic diagram of an embodiment apparatus. The apparatus includes a gas discharge laser which provides a pulsed laser beam of ultraviolet light. The embodiment shown is a KrF excimer laser; other gas discharge lasers such as XeCl and ArF may be used. The laser generates a pulsed laser beam that is reflected by mirror M1 through a variable attenuator, which is then re-directed by a switchable mirror SM2. The beam is then reflected by mirrors M3, M4, M5, M6, M7, and M8. An image-aperture lies in the beamline in between mirror M3 and mirror M4. This image-aperture reduces the overall size of the pulsed ultraviolet laser beam. The image-aperture allows passage only for a central region of the pulsed laser beam. An outer region of the pulsed laser beam cannot pass through the image-aperture. This outer region of the beam is blocked by the image-aperture. The central region of the pulsed laser beam exits the image-aperture and is reflected by a series of mirrors (M4 to M5 to M6 to M7 to M8), to a lens. The lens focuses an image of the image-aperture on a target in the deposition chamber. Materials ablated from the target are then deposited on a substrate which is also inside the deposition chamber #1.

In this embodiment, the entire apparatus is housed on a 6 foot by 10 foot optical table. It should be understood that the number of mirrors in this embodiment that are used to deflect the laser beam may be reduced, and even totally removed; the number of mirrors will depend on the space of the lab set-up.

In an embodiment, the image-aperture size was 20 mm×10 mm (i.e. 20 millimeters by 10 millimeters) for an output beam size of 25 mm×15 mm from the laser. A slightly smaller image-aperture size allows for capturing the central region of the beam with the most uniform energy distribution. Imaging the image-aperture this way resulted in a uniform spot having dimensions 3.2 mm×1.5 mm on the target shown in FIG. 3b.

Figure 2B:
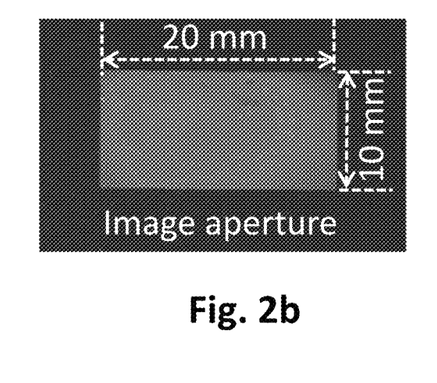
Figure 3B:
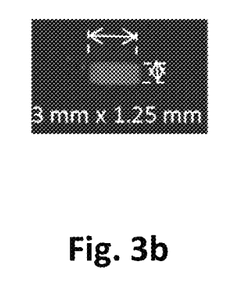

FIG. 2b provides an image of the beam spot right after the image-aperture. Image focus leads to a cleaner and more well-defined spot on the target surface. Importantly, there are no stray and/or low intensity regions around the edges. The image of FIG. 2b on a target shown in FIG. 3b is, by comparison, more uniform than the spot on a target resulting from a pure lens focus without the image-aperture as shown in FIG. 3a.

To stabilize the laser energy density on a target, the change of the beam size resulting from the degradation (or aging) of the laser gas and corresponding change in discharge voltage when operated in a constant energy mode should be addressed. This may be done by running the laser in a 'constant voltage' mode instead of a 'constant energy' mode. After studying the beam shapes at different discharge voltages, we have found that the output beam is at its maximum dimensions (25 mm×15 mm, which is the aperture of the excimer laser) at a drive voltage of 22 KV (LAMBDA PHYSIK LPX300). At this voltage, the laser is producing far more energy per pulse than required for effective growth of a wide range of materials. Importantly, the beam size is maximized and does not change.

Another benefit of running the laser at higher voltage is that the laser gas is in a state of gain saturation. This leads to better shot-to-shot reproducibility.

Figure 5:
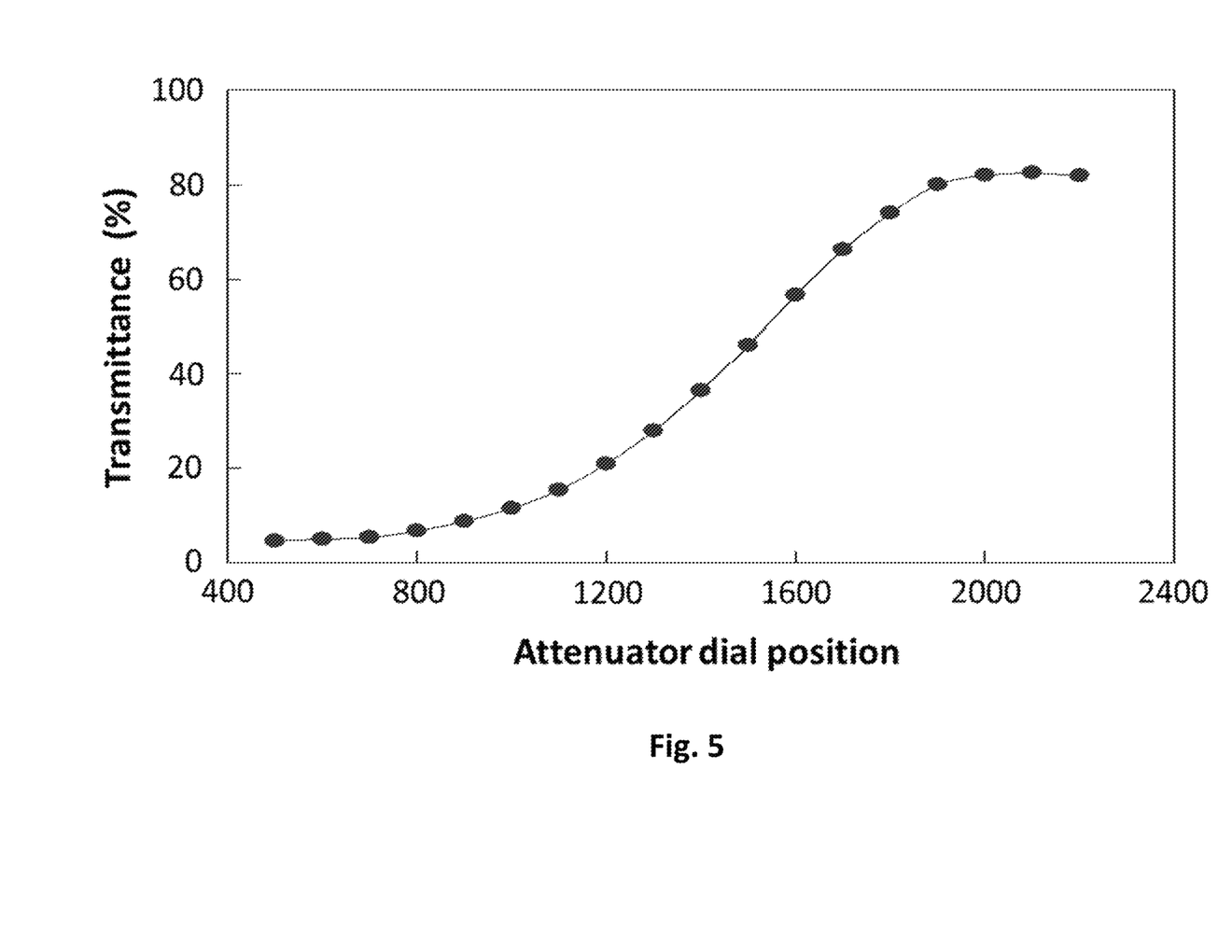
FIG. 5 shows the relationship between the transmittance of the laser energy and the dial position of the attenuator. The solid circles are the experimental data, and the line is a guide to the eye.

A continuously variable attenuator with a high enough damage threshold between the output of the laser and the imaged-aperture (as shown in FIG. 1b) controls the energy to a desired level. As shown in FIG. 5, the laser energy measured after the attenuator (labeled as transmittance in the figure) can be continuously adjusted by setting the dial position of the attenuator.

By measuring the pulse energy through the imaged-aperture and knowing the exact area of the imaged spot on a target, we can accurately adjust and control the energy density (i.e. fluence) on the target and be confident that the energy delivered is uniformly distributed across the imaged spot on the target.

Figure 6:
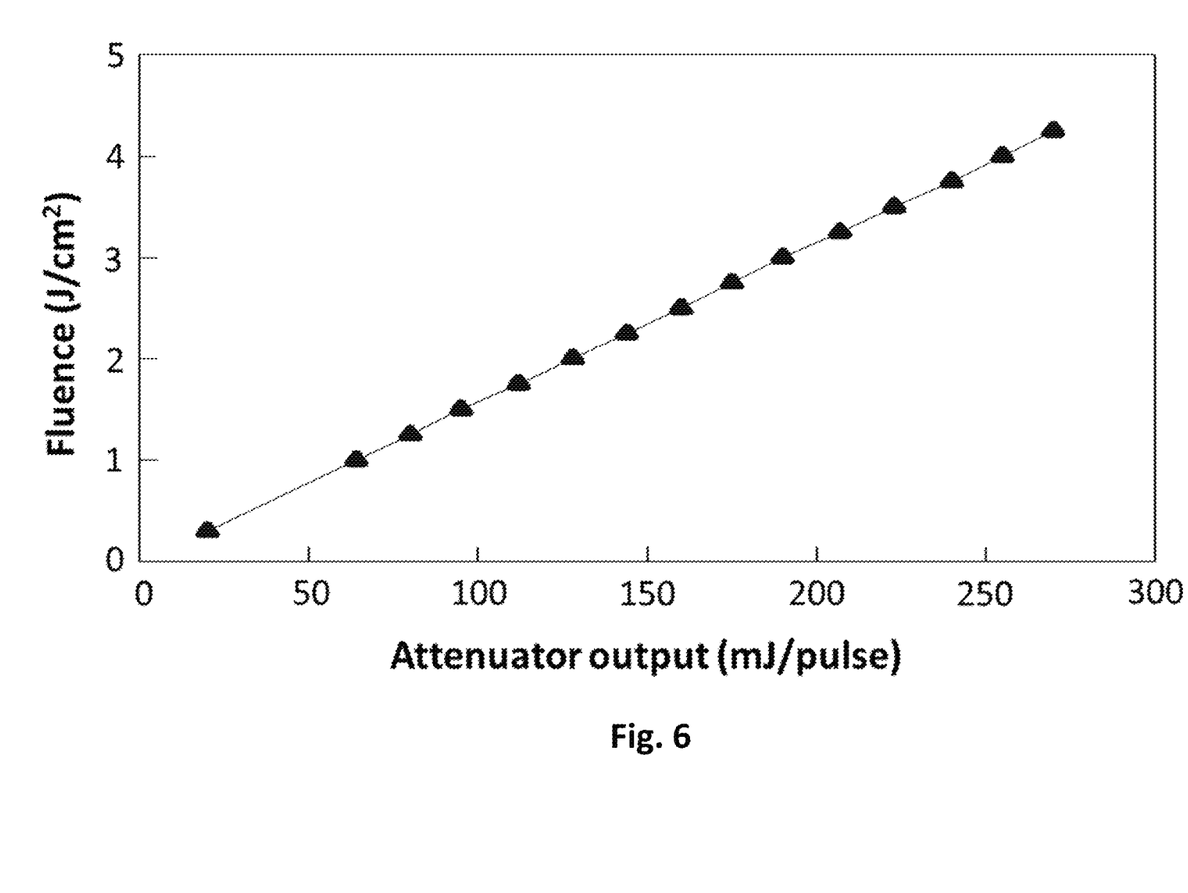
FIG. 6 shows the relationship between the fluence on the target and the energy output from the image-aperture. The solid triangles are the experimental data, and the line is a guide to the eye.

FIG. 6 provides a graph of fluence versus attenuator output. As FIG. 6 shows, the energy measured at the output of image-aperture can be continuously and accurately varied between 20 mJ/pulse and 270 mJ/pulse, which translates to an energy density in the imaged spot variable between 0.3 J/cm² and 4.25 J/cm² on the target, respectively.

Thus, an embodiment process has been invented for stabilizing laser energy density during pulsed laser deposition. The embodiment process generates laser beam pulses of ultraviolet light. The pulses are directed to an image-aperture. The image-aperture allows a chosen central portion of the beam through the image-aperture while preventing passage of an outer portion of the laser beam. The pulses of the central portion of the beam that pass through the image-aperture are directed to a lens. The lens has a focal length and produces a de-magnified focused image of the image-aperture on a target inside a deposition chamber according to the equation $$\frac{1}{f} = \frac{1}{s_i} + \frac{1}{s_o}.$$

Thus, the lens produces a focused image of the aperture on the target. In this equation, f represents a value for the focal length of the lens, $s_i$ represents a value for the distance from the lens to the image of the laser beam pulses on the target, and $s_o$ represents a value for the distance from the image-aperture to the lens. The pulses travel from the lens to the target in the deposition chamber. Thus, the image size in the target is controlled. The laser beam pulses ablate material from the target. Material ablated from the target deposits as a film on the substrate in the deposition chamber.

Examples of materials that can be deposited include but are not limited to metal oxides, metal nitrides, and mixtures of metal oxides and metal nitrides. The types of materials will depend on the target(s) used.

Films that may be prepared include, but are not limited to, high-temperature superconducting cuprates, ferroelectric metal oxides, ferromagnetic metal oxides, and multiferroic metal oxides.

The image-aperture may reduce the cross sectional area of the laser beam pulses by from about 50% to about 75%.

The image-aperture may have a variety of spatial profiles. Examples include, but are not limited to a rectangular spatial profile, a square spatial profile, a circular spatial profile, and other spatial profiles.

Another embodiment relates to a process for producing metal oxide films on a substrate using laser pulses having a stabilized energy density. The process generates laser beam pulses of ultraviolet light from an excimer laser. The laser generates the pulses of light. The light travels through space while being directed by mirrors, as needed, to a desired direction. In this embodiment, the laser beam pulses are directed to an image-aperture that allows passage of a chosen central portion of the laser beam pulses through the image-aperture while preventing passage of an outer portion of the laser beam pulses through the image-aperture. Afterward, the laser beam travels from the image-aperture to a lens. The lens has focal length and produces a de-magnified image of the image-aperture on a target inside a deposition chamber according to an equation $$\frac{1}{f} = \frac{1}{s_i} + \frac{1}{s_o},$$

wherein f is a value for the focal length of lens, wherein $s_i$ is a value for a distance from the lens to the image of the laser beam on the target, and wherein $s_o$ is a value for a distance from the image-aperture to the lens. The target in this embodiment includes a metal oxide material. Some non-limiting examples of metal oxides include, but are not limited to, transition metal oxides, main group metal oxides, lanthanide oxides, and actinide oxides. Scandium oxide, yttrium oxide, lanthanum oxide, titanium oxide, zirconium oxide, hafnium oxide, vanadium oxide, niobium oxide, tantalum oxide, chromium oxide, molybdenum oxide, tungsten oxide, manganese oxide, technetium oxide, rhenium oxide, iron oxide, ruthenium oxide, osmium oxide, cobalt oxide, rhodium oxide, iridium oxide, nickel oxide, palladium oxide, platinum oxide, copper oxide, silver oxide, gold oxide, zinc oxide, cadmium oxide, mercury oxide, magnesium oxide, lithium oxide, barium oxide, aluminum oxide, gallium oxide, antimony oxide, bismuth oxide, silicon oxide, and the like. For embodiments that include metal nitrides, the target would include a metal nitride material. Some non-limiting examples of metal nitrides are nitrides of transition and main group metals disclosed above. Another embodiment relates to the preparation of films including mixtures of metal oxides and metal nitrides. For producing such embodiments, the target would include both a metal oxide(s) and a metal nitride. Alternatively, multiple targets could be used that would include a metal oxide target and a metal nitride target.

The laser beam pulses are directed from the lens to the target in the deposition chamber. Thus, the embodiment stabilizes the laser energy density on the target. The laser beam pulses ablate material from the target. Material ablated from the target, which includes metal oxide material, becomes deposited on the substrate.

Another embodiment includes an apparatus for depositing ablated material from a target to a substrate. The apparatus, which is shown in FIG. 1b, includes a deposition chamber for housing a target and a substrate (see insert at the top of FIG. 1b), a substrate inside the deposition chamber, a target inside the deposition chamber, the target including a material or materials to be deposited on the substrate. A pulsed discharge laser provides laser beam pulses of ultraviolet light in a beamline. The laser beam pulses have a laser energy density. The embodiment includes a variable attenuator for adjusting the laser energy of the laser beam. The embodiment also includes an image-aperture in the beamline for producing a de-magnified image of a central portion of the laser beam on the target, where de-magnified image ratio is defined by $$m = -s_i/s_o$$

wherein $s_i$ is the image distance from the lens to the image on the target, and $s_o$ is the object distance from the image-aperture to the lens.

The following non-limiting examples of materials were prepared using the embodiment apparatus described above.

Examples

Preparation of Superconducting $YBa_2Cr_3O_{7-\delta}$ Films

The embodiment apparatus of FIG. 1b was used to deposit superconducting $YBa_2Cu_3O_{7-\delta}$ (YBCO) films on (100) $SrTiO_3$ at different energy densities by adjusting the dial on the attenuator appropriately. The target was a stoichiometric $YBa_2Cu_3O_x$ pellet commercially available from MTI CORPORATION (Richmond, Calif., USA). The laser (KrF, $\lambda$=248 nm) operated at a repetition rate of 10 Hz at a constant voltage of 22 kV. The depositions were done at a temperature of 790° C., an oxygen pressure of 200 mTorr, and a distance of 5.5 cm from the target to the substrate. The deposited YBCO films were cooled to room temperature in an oxygen pressure of 250 Torr without any further treatment.

Figure 7:
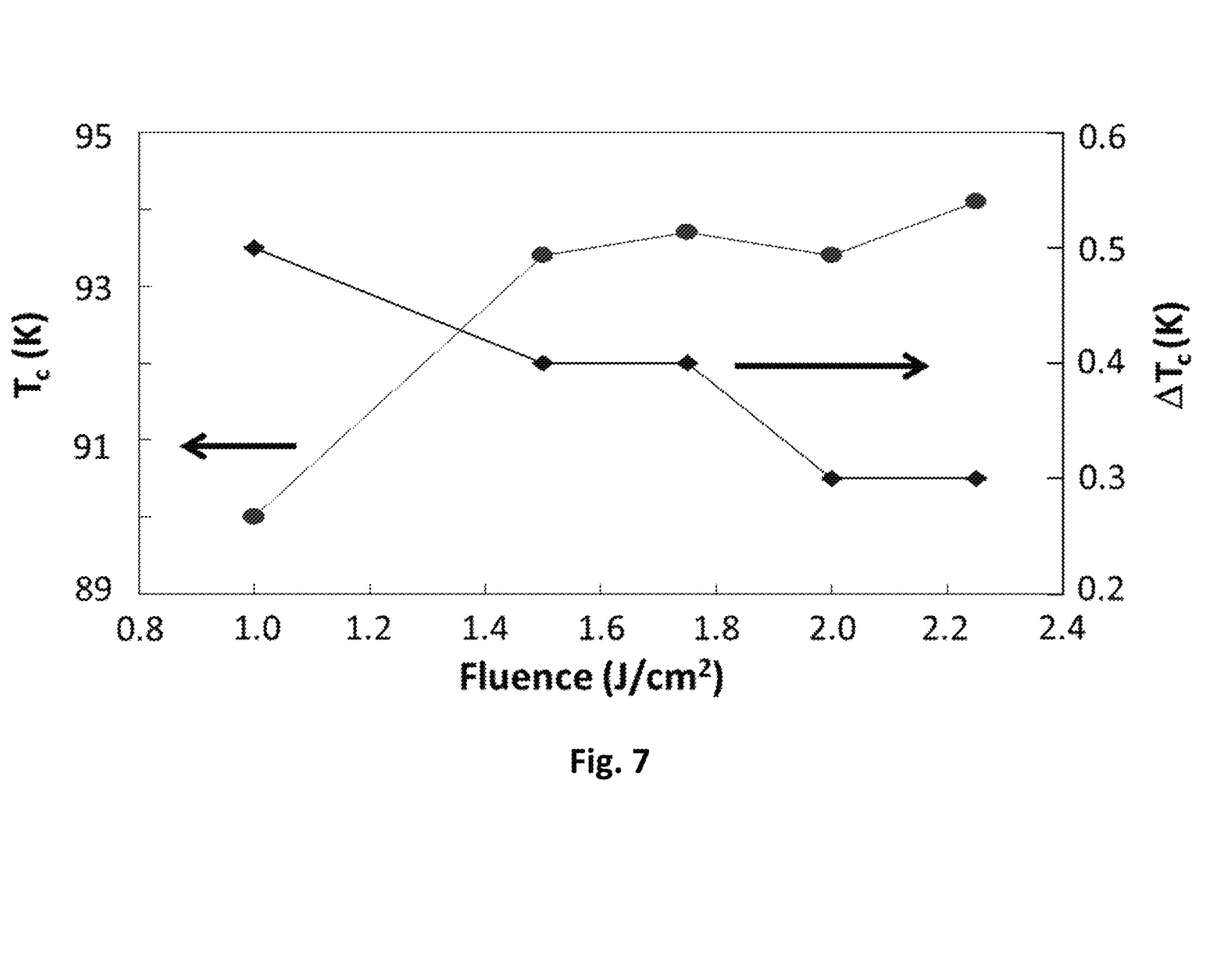
FIG. 7 shows a graph of superconductor transition temperature ($T_c$) and transition width ($\Delta T_c$) of $YBa_2Cu_3O_{7-x}$ (YBCO) films as a function of fluence. All films were deposited using the embodiment apparatus described in FIG. 1b under the same processing conditions except for the fluence. The positions of the solid circles and diamonds represent experimental data, and the lines are a guide to the eye.

FIG. 7 provides a graph of superconducting transition temperature versus fluence for the films which were deposited using different fluence. As FIG. 7 shows, at a fluence lower than 1.5 J/cm², the superconducting film showed lower transition temperature and broad transition width.

The stoichiometry in the deposited film can be different from that of the target if the fluence is below an ablation threshold. Both the transition temperature and the transition width of the superconducting films reach their desired values when the fluence is above 1.5 J/cm². This example shows that the fluence plays an important role in the deposition of high performance YBCO films. We can easily optimize the laser fluence using the embodiment shown in FIG. 1b for the growth of high quality superconducting films.

Preparation of YBCO/$La_{0.7}Sr_{0.3}MnO_3$ Films

Figure 8:
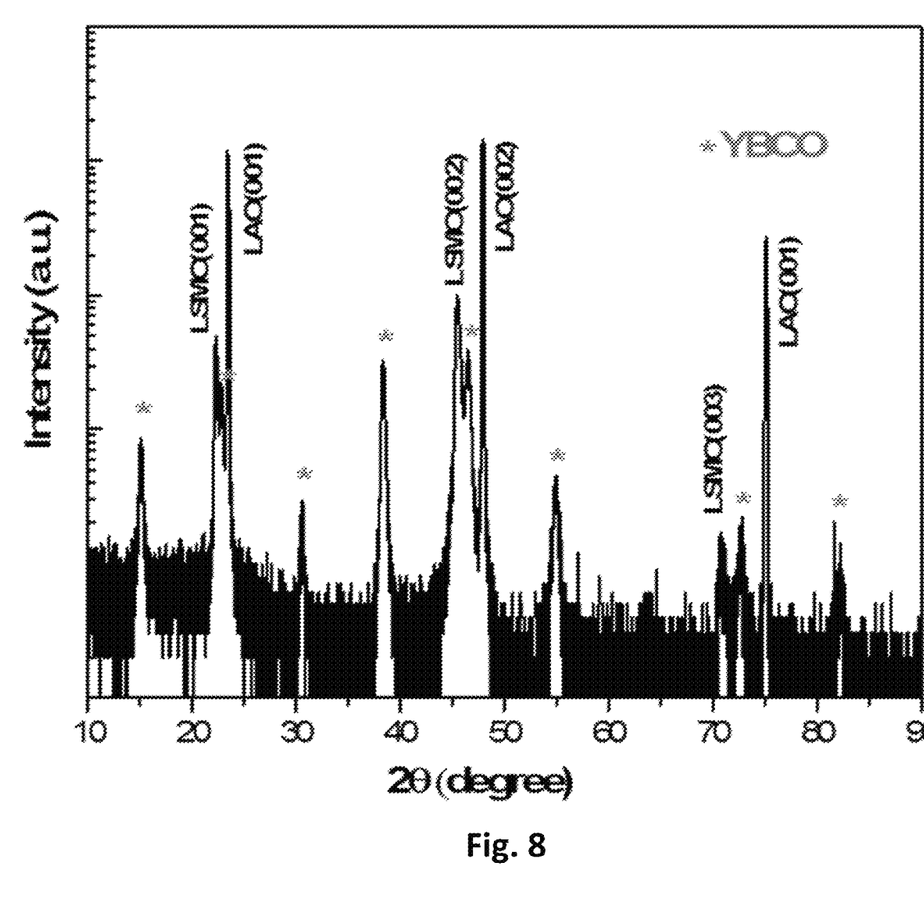
FIG. 8 shows an X-ray diffraction scan of a bilayer YBCO on $La_{0.7}Sr_{0.3}MnO_3$ (LSMO) on a $LaAlO_3$ substrate deposited using the embodiment apparatus described in FIG. 1b.

Using the embodiment apparatus of FIG. 1b, YBCO films were deposited on $La_{0.7}Sr_{0.3}MnO_3$ (LSMO) on (100) $LaAlO_3$ substrates. The KrF excimer laser operated at a repetition rate of 10 Hz at a constant voltage of 22 kV. The deposition conditions were individually optimized for LSMO and YBCO and were adjusted to deposit the bilayer YBCO/LSMO with desired physical properties. All depositions were done at a temperature of 790° C., an oxygen pressure of 200 mTorr, and a distance of 5.5 cm from the target to the substrate. The bilayer was deposited by switching the target using a computer controlled multi-target carousel. FIG. 8 shows the x-ray diffraction θ-2θ patterns of the bilayer film. As can be seen from the figure, both LSMO and YBCO are highly c-axis oriented. The values for the full width at half-maximum (FWHM) of diffractions of (006) YBCO and (002) LSMO are 0.727° and 0.607°, respectively.

In summary, we have developed apparatus and process to stabilize laser energy density on a target in pulsed laser deposition. By driving the laser its maximum voltage level, we have a better control of beam size and a stable energy output. By introducing a variable energy attenuator between the aperture of excimer laser and the image-aperture, using a well-defined aperture (image-aperture) to capture the central region of the output beam of the laser where the spatial distribution of energy is most uniform, and imaging that aperture on the target surface, we can accurately control the imaged laser spot on the target and importantly stabilize the laser energy density (i.e. fluence). This process leads to better controllability and reproducibility of pulsed laser deposition of films and may find broad applications in laser ablation of a wide range of materials.

Although the present invention has been described with reference to specific details, it is not intended that such details should be regarded as limitations upon the scope of the invention, except as and to the extent that they are included in the accompanying claims.

The following reference are incorporated by reference herein.

REFERENCES

[1] Dijkkamp et al., "Preparation of YBaCu oxide superconductor thin films using pulsed laser evaporation from high Tc bulk material," Appl. Phys Lett. (August 1987), vol. 51, pp. 619-621.
[2] Lowndes et al., "Synthesis of novel thin-film materials by pulsed laser deposition," Science (August 1996), vol. 273, pp. 898-903.
[3] Shirk et al., "A review of ultrashort pulsed laser ablation of materials," J. Laser Appl. (February 1998), vol. 10, pp. 18-28.
[4] Jackson et al., "Oxide superconductor and magnetic thin film deposition by pulsed laser ablation: a review," J. Phys. D: Appl. Phys. (August 1994), vol. 27, pp. 1581-1594.
[5] Ashfold et al., "Pulsed laser ablation and deposition of thin films," Chem. Soc. Rev. (January 2004), vol. 33, pp. 23-31, published on web August 2003.
[6] Christen et al., "Recent advances in pulsed-laser deposition of complex oxides," J. Phys.: Condens. Matter (June 2008), vol. 20, pp. 264005 (16 pages).
[7] "Pulsed Laser Deposition of Thin Films," edited by D. B. Chrisey and G. K. Hubler, John Wiley & Sons, New York (1994), pages 34-42
[8] Greer et al., "Large-area pulsed laser deposition: Techniques and applications," J. Vac. Sci. Technol. A (May 1995), vol. 13, pp. 1175-1181.

What is claimed is:

1. A process for stabilizing laser energy density on a target during pulsed laser deposition, comprising:
   generating laser beam pulses of ultraviolet light from a laser; and thereafter
   directing the laser beam pulses to an image-aperture that allows passage of a chosen central portion of the laser beam through the image-aperture while preventing passage of an outer portion of the laser beam through the image-aperture; and thereafter
   directing the laser beam pulses from the image-aperture to a lens having a focal length, the lens producing a de-magnified image of the image-aperture on a target inside a deposition chamber according to an equation $$\frac{1}{f} = \frac{1}{s_i} + \frac{1}{s_o},$$

wherein f is a value for the focal length of the lens, wherein $s_i$ is a value for a distance from the lens to the image of the laser beam on the target, and wherein $s_o$ is a value for a distance from the image-aperture to the lens; and thereafter
   directing the laser beam pulses from the lens to the target in the deposition chamber, thereby stabilizing the laser energy density on the target, the laser beam pulses ablating material from the target; and thereafter
   depositing a film onto the substrate from ablated material from the target.

2. The process of claim 1, further comprising a step of controlling the laser beam prior to the step of directing the pulses to the image-aperture.

3. The process of claim 1, wherein the laser comprises a gas discharge laser.

4. The process of claim 3, wherein the gas discharge laser comprises an excimer laser.

5. The process of claim 4, wherein the excimer laser is selected from an ArF laser, a KrF laser, or a XeCl laser.

6. The process of claim 1, wherein the target comprises a metal oxide.

7. The process of claim 1, wherein the target comprises a metal nitride.

8. The process of claim 1, wherein the film comprises a metal oxide, a metal nitride, or a mixture thereof.

9. The process of claim 1, wherein the films are high-temperature superconducting cuprates, ferroelectric metal oxides, ferromagnetic metal oxides, and multiferroic metal oxides.

10. A process for producing an oxide film on a substrate using laser pulses having a stabilized energy density, comprising:
    generating laser beam pulses comprising a first laser of ultraviolet light from an excimer laser; and thereafter
    directing the laser beam pulses to an image-aperture that allows passage of a chosen central portion of the laser beam pulses through the image-aperture while preventing passage of an outer portion of the laser beam pulses through the image-aperture; and thereafter
    directing the laser beam pulses from the image-aperture to a lens having a focal length, the lens producing a de-magnified image of the image-aperture on a target inside a deposition chamber according to an equation $$\frac{1}{f} = \frac{1}{s_i} + \frac{1}{s_o},$$

wherein f is a value for the focal length of the lens, wherein $s_i$ is a value for a distance from the lens to the image of the laser beam on the target, and wherein $s_o$ is a value for a distance from the image-aperture to the lens, the target comprising a metal oxide; and thereafter
    directing the laser beam pulses from the lens to the target in the deposition chamber, thereby stabilizing the laser energy density on the target, the laser beam pulses ablating material from the target; and thereafter
    depositing an oxide film onto the substrate from ablated material from the target.

11. The process of claim 10, wherein the film comprises high-temperature superconducting cuprates, ferroelectric metal oxides, ferromagnetic metal oxides, and multiferroic metal oxides.

* * * * *